US008901894B2

(12) United States Patent
Sato et al.

(10) Patent No.: US 8,901,894 B2
(45) Date of Patent: Dec. 2, 2014

(54) BATTERY MANAGEMENT CONTROL METHOD

(75) Inventors: Tetsuo Sato, San Jose, CA (US); Tsutomu Kawano, Sagamihara (JP); Koji Kashimoto, Hino (JP); Takao Hidaka, Machida (JP); Tsuyoshi Ota, Chofu (JP); Ryoji Kato, Tokyo (JP)

(73) Assignee: Renesas Electronics America Inc., Santa Clara, CA (US)

( * ) Notice: Subject to any disclaimer, the term of this patent is extended or adjusted under 35 U.S.C. 154(b) by 655 days.

(21) Appl. No.: 13/088,541

(22) Filed: Apr. 18, 2011

(65) Prior Publication Data

US 2012/0262122 A1    Oct. 18, 2012

(51) Int. Cl.
*H02J 7/06* (2006.01)
*H02J 7/00* (2006.01)

(52) U.S. Cl.
CPC ........................................ *H02J 7/00* (2013.01)
USPC .......................................... 320/164; 320/136

(58) Field of Classification Search
USPC .................................. 320/128, 134, 136, 164
See application file for complete search history.

(56) References Cited

U.S. PATENT DOCUMENTS

| 5,119,011 A | 6/1992 | Lambert .......................... 320/43 |
| 5,672,951 A | 9/1997 | Shiota ............................... 320/5 |
| 6,064,185 A | 5/2000 | Ohno ............................. 320/136 |
| 6,407,532 B1 | 6/2002 | Ruha ............................. 320/128 |
| 6,507,171 B2 * | 1/2003 | Ruha et al. ..................... 320/128 |
| 2004/0075462 A1 * | 4/2004 | Kizer et al. ..................... 326/29 |

* cited by examiner

*Primary Examiner* — Edward Tso
*Assistant Examiner* — Aaron Piggush
(74) *Attorney, Agent, or Firm* — Campbell Stephenson LLP

(57) ABSTRACT

A battery management method and apparatus. In one embodiment of the method, a source current is divided into Ic and Icr. Ic is transmitted to and charges a battery. A first voltage is generated that is related to Icr. The first voltage is converted into a first digital signal. A processing unit receives and processes the first digital signal in accordance with instructions stored in a memory. The transmission of Ic to the battery is interrupted in response to the processing unit processing the first digital signal. Current provided by the battery is divided into Idc and Idcr. Idc is transmitted to a device. A second voltage is generated that is related to Idcr. The second voltage is converted into a second digital signal. The processing unit receives and processes the second digital signal in accordance with instructions stored in the memory. The transmission of Idc to the battery is interrupted in response to the processing unit processing the second digital signal.

13 Claims, 5 Drawing Sheets

BATTERY MANAGEMENT CONTROL METHOD

BACKGROUND OF THE INVENTION

A rechargeable battery or storage battery is typically a group of one or more electrochemical cells. They are sometimes known as secondary cells because their electrochemical reactions are electrically reversible. Rechargeable batteries come in many different shapes and sizes. Several different combinations of chemicals are commonly used, including: lead-acid, nickel cadmium (NiCd), nickel metal hydride (NiMH), lithium ion (Li-ion), and lithium ion polymer (Li-ion polymer).

Rechargeable batteries are used for portable consumer devices (e.g., smart phones, tablets, laptop computers, notebook computers, etc.), vehicles (such as motorized wheelchairs, golf carts, etc.), tools, uninterruptible power supplies, etc. Emerging applications in hybrid electric vehicles and electric vehicles are driving the technology to reduce cost and weight and increase lifetime. The present invention will be described with reference to a rechargeable battery used in portable consumer devices such as laptop computers, it being understood that the present invention should not be limited thereto.

The energy used to recharge batteries usually comes from a battery charger that provides a source of charging current. Chargers take from a few minutes (rapid chargers) to several hours to charge a battery. During the charging process, charging current is often measured and monitored for a variety of reasons. Charged energy flows from the batteries to one or more loads such as a central processing unit (CPU), backlight, hard disk drive (HDD), etc. During the discharge process, discharging current is often measured and monitored for a variety of purposes.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
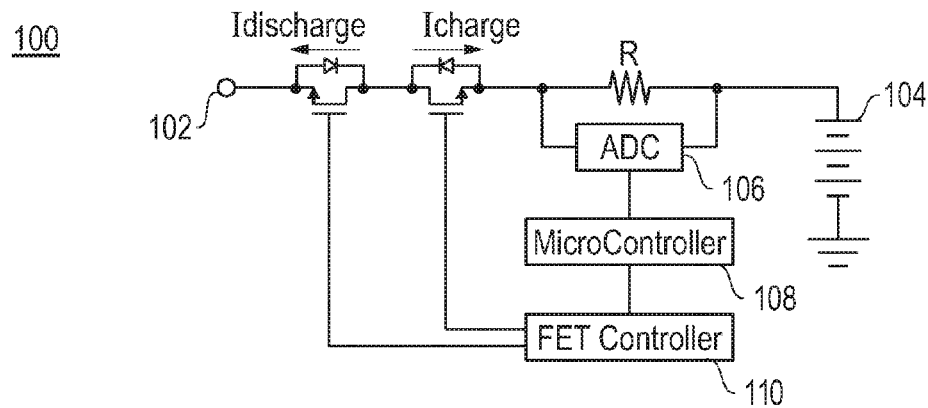
FIG. 1 is a block diagram illustrating an example battery management control circuit.

FIG. 1 shows a circuit 100 for measuring and monitoring current flow into/out of a battery during a charging/discharging operation. Circuit 100 includes a resistor R placed in series with a source/load (not shown) coupled to node 102 and battery 104 as shown. Field effect transistors (FETs) are coupled between node 102 and resistor R and operates to control the flow of current I into/out of battery 104. Voltage V=IR is created across resistor R while the battery is charged/discharged. Analog-to-digital converter (ADC) 106 generates a digital equivalent Vdigital of the voltage V at regularly scheduled times. Vdigital is processed by a microcontroller 108 to calculate a digital equivalent of current I. The microcontroller monitors battery 104 voltage and turns off the charging FET when the battery voltage indicates the battery is at full charge voltage, or the microcontroller turns off the discharging FET when the battery voltage reaches full discharging voltage. The ADC provides charge/discharge current values and duration to the microcontroller so that it can calculate the energy remaining on the battery as a fuel gauge.

The use of series connected resistor R to measure and monitor current flow presents several problems. To accurately measure current flow into/out of battery 104 during the charging/discharging process, R should be a low ohmic, high precision resistor. Due to relatively significant current flow I, resistor R should also be large enough to dissipate the resulting heat. A large IR drop shortens the battery operation time because the output voltage provided at terminal 102 is reduced by voltage drop RI. The use of a physically large resistor might require use of a separate, discreet component as opposed to an integrated component, which may increase the cost as well as the manufacturing complexity of the circuit 100. Also because of the low ohmic value of R1, the resulting voltage drop across R is small, which may require the use of a high resolution ADC 106 to obtain an accurate measurement of voltage V. Additional issues surround the use of a series connected resistor.

The present invention relates to a battery control management method and circuit. The present invention is described below in connection with several embodiments. However, the present invention is not intended to be limited to the specific forms set forth herein. On the contrary, it is intended to cover such alternatives, modifications, and equivalents as can be reasonably included within the scope of the invention as defined by the appended claims.

References in the specification to "one embodiment" or "an embodiment" means that a particular feature, structure, or characteristic described in connection with the embodiment is included in at least one embodiment of the present invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 2:
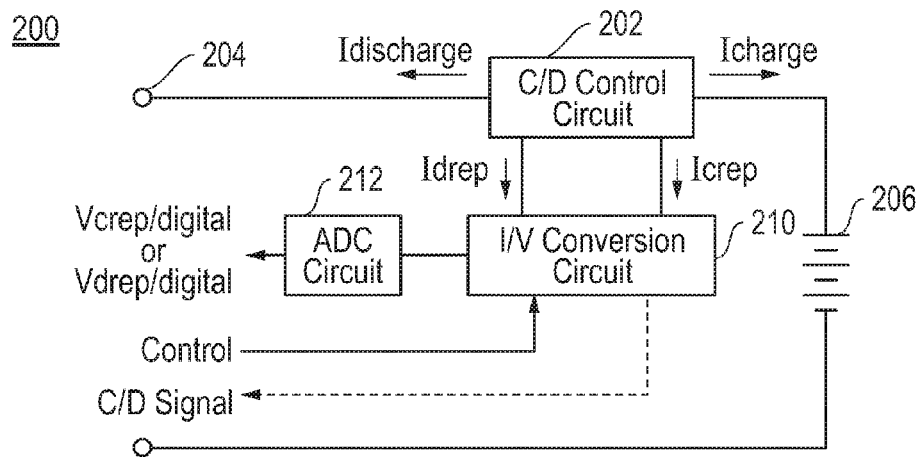
FIG. 2 is a block diagram illustrating an example battery management control circuit.
Figure 3:
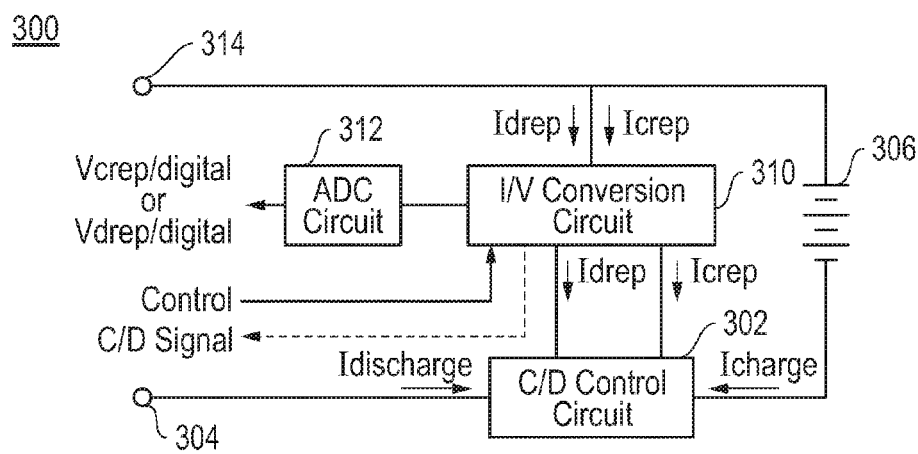
FIG. 3 is a block diagram illustrating an example battery management control circuit.

FIGS. 2 and 3 illustrate alternative, example embodiments of a battery management control circuit, which are capable of performing various functions during a battery charging or discharging operation. The battery management control circuits are capable of measuring and monitoring various parameters in real time. For example, the battery management control circuits are capable of measuring and monitoring current flow into or out of a rechargeable battery, battery charge level, etc.

The battery management control circuit of FIG. 2 includes a charge/discharge (C/D) control circuit 202 coupled between a node 204 and a rechargeable battery 206. A current-to-voltage (UV) conversion circuit 210 is coupled to C/D control circuit 202 and to an analog-to-digital converter (ADC) circuit 212.

The battery management control circuit of FIG. 2 operates in a battery charging mode or a battery discharging mode. In the battery charging mode, a charger (not shown) is coupled to and provides a source current to node 204. C/D control circuit 202 divides the source current into Icharge, which charges battery 206, and Icrep. As will be more fully described, Icrep is proportional to Icharge, and Icrep can be used to monitor various parameters in real time such as Icharge, the charge level on battery 206, etc. In the battery discharge mode of operation, C/D control circuit 202 receives a battery discharge current from battery 206. C/D control circuit 202 divides the battery discharge current into Idischarge, which drives a load (not shown) coupled to node 204, and Idrep. As will be more fully described, Idrep is proportional to Idischarge, and Idrep can be used to monitor various parameters in real time such as the battery discharge current (i.e., Idischarge+Idrep), the charge level on battery 206, etc. For ease of explanation only, Icrep and Idrep will be used to measure and monitor current flow into or out of batter 206 and the charge level thereon, it being understood that Icrep and Idrep can be used to measure and monitor other parameters.

I/V conversion circuit 210 receives Icrep or Idrep depending whether the circuit is operating in the charging mode or discharging mode. I/V conversion circuit 210 generates analog voltages Vdrep and Vcrep as a function of Idrep and Icrep, respectively. ADC circuit 212 converts Vdrep and Vcrep into digital equivalents Vdrep/digital and Vcrep/digital, respectively. I/V conversion circuit 210, depending on the embodiment of the battery management control circuit, may optionally generate a C/D signal, which indicates whether the battery management control circuit is operating in the charging mode or discharging mode.

A processing unit (not shown) such as a microcontroller, microprocessor, etc., processes Vdrep/digital or Vcrep/digital in accordance with instructions stored in memory. More particularly, the processing unit may calculate real time values for the battery charging current (i.e., Icharge) or the battery discharging current (i.e., Idischarge+Idrep) as a function of Vcrep/digital or Vdrep/digital, respectively. The processing unit may also compare the calculated values for Icharge and Idischarge+Idrep with respective predetermined values. If the calculated value for Icharge or Idischarge+Idrep is found to exceed its respective predetermined value, the processing unit may send a control signal to I/V conversion circuit 210, which in turn may instruct C/D control circuit 202 to interrupt the flow of current into or out of battery 206. The processing unit may also calculate the charge level on battery 206 in real time using Vcrep/digital or Vdrep/digital. The processing unit may compare the calculated charge level with respective predetermined values. If the calculated charge level exceeds a predetermined value during the charging mode, or if the calculated charge level falls below an acceptable level during the discharging mode, the processing unit may send a control signal to I/V conversion circuit 210, which in turn instructs C/D control circuit 202 to interrupt the flow of current into or out of battery 206.

The battery management control circuit of FIG. 3 includes a C/D control circuit 302 coupled between node 304 and battery 306. An I/V conversion circuit 310 is coupled to C/D control circuit 302 and ADC circuit 312.

Like the battery management control circuit of FIG. 2 the battery management circuit of FIG. 3 can operate in a battery charging mode or in a battery discharging mode. In the charging mode of operation a charger (not shown) is coupled to node 314 and provides a source current thereto. C/D control circuit 302 draws Icrep, which is a portion of the source current, via I/V conversion circuit 310. Icharge, the remaining portion of the source current, charges battery 306. Battery 306 generates a battery discharge current during the discharge mode of operation. C/D control circuit 302 draws Idrep, a portion of the battery discharge current, via I/V conversion circuit 310. Idischarge, the remaining portion of the battery discharge current, drives a load (not shown) at node 314. For purposes of explanation only, Icrep and Idrep will be used to measure and monitor current flow into or out of batter 306 and the charge level thereon, it being understood that Icrep and Idrep can be used to measure and monitor other parameters.

I/V conversion circuit 310 generates analog voltages Vdrep or Vcrep as a function of Idrep or Icrep, respectively. ADC circuit 312 converts Vdrep and Vcrep into digital equivalents Vdrep/digital and Vcrep/digital, respectively. I/V conversion circuit 310, depending on the embodiment of battery management control circuit, may optionally generate a C/D signal indicating whether the battery management control circuit is operating in the charging mode or discharging mode.

A processing unit (not shown) can measure and monitor various parameters in real time such as current flowing into or out of rechargeable battery 306 in the same or similar manner as described with reference to FIG. 2. For example, the processing unit may calculate real time values for Icharge or Idischarge+Idrep, compare the calculated values for Icharge and Idischarge+Idrep with respective predetermined values, interrupt the flow of current into or out of battery 306 if the calculated values for Icharge or Idischarge+Idrep exceed predetermined limits, etc.

Figure 4:
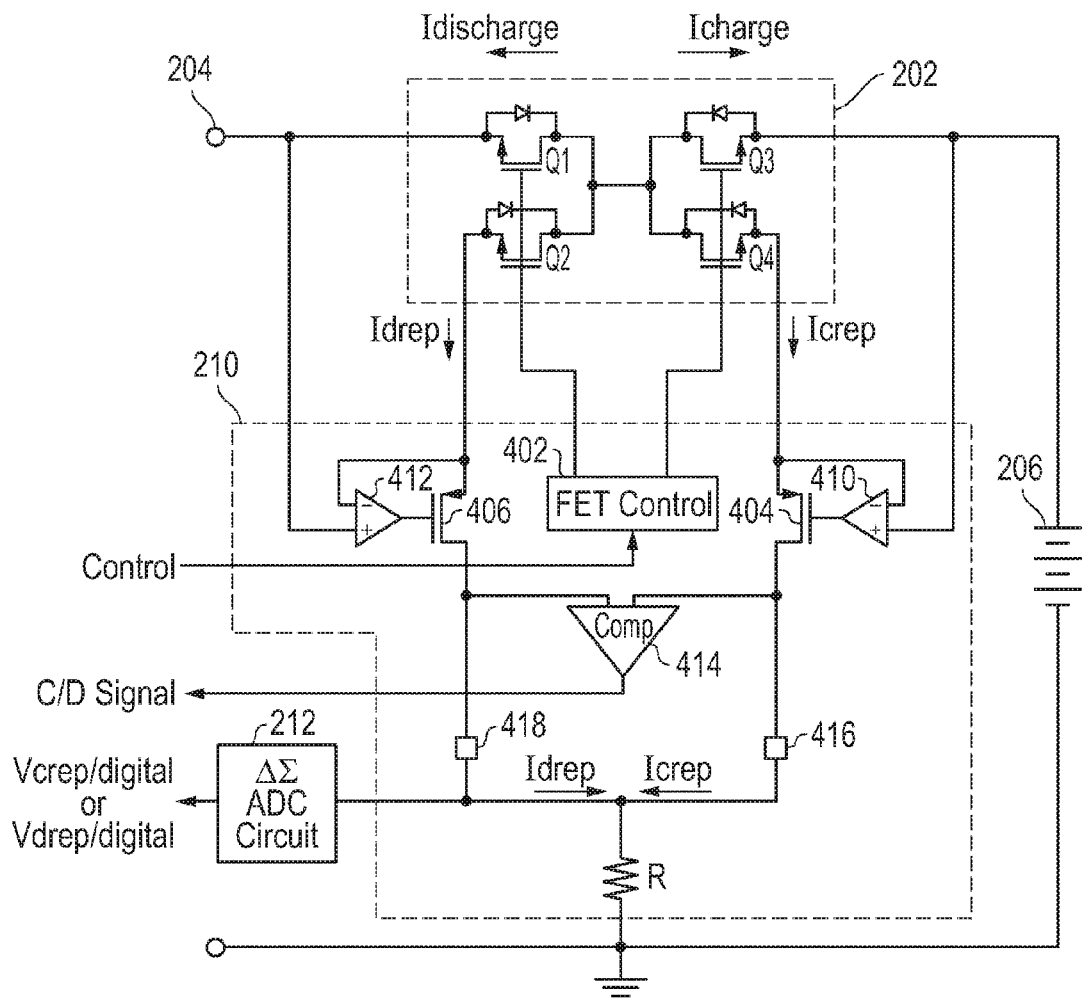
FIG. 4 is a block diagram illustrating an embodiment of the battery management circuit shown in FIG. 2.

FIG. 4 illustrates one embodiment of the battery management control circuit shown in FIG. 2. In FIG. 4, the ADC circuit 212 takes form in a delta-sigma ADC, which is a device well known in the art. For ease of explanation, the remaining description will presume that all ADCs take form in a delta-sigma ADC, it being understood the present invention should not be limited thereto.

With continuing reference to FIG. 4, The C/D control circuit 202 includes a set of FETs Q1-Q4 coupled between node 204 and rechargeable battery 206 as shown. The I/V conversion circuit 210 contains several components including a FET control circuit 402, which controls FETs Q1-Q4. Gates of FETs 404 and 406 are coupled to outputs of operational amplifiers (op amps) 410 and 412, respectively. High impedance inputs to op amp 410 are coupled to the sources of FETs Q3 and Q4, while high impedance inputs to op amp 412 are coupled to the sources of FETs Q1 and Q2. In this configuration op amp 410 maintains the sources of FETs Q3 and Q4 at the same potential, and op amp 412 maintains the sources of FETs Q1 and Q2 at the same potential.

During the charging mode of operation, FET control 402 activates FETs Q1-Q4. Current from the charging source (not shown) flows through FET Q1 and is divided by FETs Q3 and Q4 into Icharge and Icrep. Icharge charges battery 206 via FET Q3, while Icrep flows to I/V conversion circuit 210 via FET Q4. Icrep can be used to monitor Icharge and the charge level on battery 206. If Icharge or the charge level on battery 206 exceed respective predetermined values, FET control 402 turns off at least Q3 and Q4 in accordance with input signals received indirectly from the processing unit (not show). During the battery discharge mode of operation, FET control 402 activates FETs Q1-Q4. Current from battery 206 flows through FET Q3 and is divided by FETs Q1 and Q2 into Idischarge and Idrep. Idischarge drives a load (not shown) coupled to node 204, while Idrep flows to I/V conversion circuit 210 via FET Q2. Idrep can be used to monitor current flow out of battery 206 and the charge level thereof. If the current flow is too high and/or if the charge level on battery 206 is too low, FET control 402 in one embodiment turns off at least Q1 and Q2 in accordance with input signals indirectly received from the processing unit.

I/V conversion circuit 210 includes a voltage comparator 414 with high impedance inputs, which compares the voltages at the drains of FETs 406 and 404. In the charging mode, Icrep flows through FET 404 to resistor R and creates a voltage drop across resistive element 416. Because no current flows through FET 406, the voltage at the drain of FET 404 will be higher than the voltage at the drain of FET 406. Comparator circuit 414 detects this difference and generates a first C/D signal (e.g., a logical one or high voltage), which indicates that battery management control circuit 400 is in the charging mode of operation. In the discharging mode, Idrep flows through FET 406 to resistor R and creates a voltage drop across resistive element 418. Because no current flows through FET 404, the voltage at the drain of FET 406 will be higher than the voltage at the drain of FET 404. Comparator circuit 414 detects this voltage difference and generates a second C/D signal (e.g., a logical zero or low voltage), which indicates to the processing unit that battery management control circuit 400 is in the discharge mode of operation.

A resistor R is coupled to the high impedance input of ADC 212 a shown. An analog voltage Vcrep or Vdrep is created across R by Icrep or Idrep, respectively. ADC 212 samples Vcrep or Vdrep at regularly scheduled times to generate corresponding digital values Vcrep/digital or Vdrep/digital, respectively. When the processing unit receives a C/D control signal indicating that battery management control circuit 400 is in the charging mode of operation, the processing unit may calculate values for Icharge and/or the charge level on battery 206 as a function of Vcrep/digital, the impedance of R and a known relationship between Icharge and Icrep, which is more fully described below. The processing unit compares the values for Icharge and/or charge levels to respective predetermined values. If the value for Icharge and/or if the charge level exceed their respective predetermined values, C/D control circuit 202 should interrupt the flow of Icharge into battery 206 by turning off at least FETs Q3 and Q4. When the processing unit receives a C/D control signal indicating a discharge mode of operation, the processing unit may calculate values for Idischarge+Idrep (i.e., the battery discharge current) and/or the charge level on battery 206 as a function of Vdrep/digital, the impedance of R, and a known relationship between Idischarge and Idrep, which is more fully described below. The processing unit compares the values for Idischarge+Idrep and/or charge level to respective predetermined values. If the calculated value for Idischarge+Idrep exceeds the predetermined value against which it is compared, and/or if the calculated battery charge level drops below the predetermined value against which it is compared, the C/D control circuit should be instructed to interrupt the flow of current out of battery 206 by turning off at least FETs Q1 and Q2.

All components of the battery management control circuits described above or below may take form in one integrated circuit that is formed on a single substrate or die. In another embodiment, components of the battery management control circuits may take form in two or more integrated circuits on separate substrates, for example, that are mounted on a printed circuit board and coupled together via traces formed thereon. With continuing reference to FIG. 4, FETs Q1-Q4 may be formed on a single substrate. In an alternative embodiment, FETs Q1 and Q2 may be formed on one substrate, while FETs Q3 and Q4 may be formed on another, separate substrate using the same manufacturing process used to form FETs Q1 and Q2. I/V conversion circuit 210 may also take form in an integrated circuit that is formed on a single substrate that is separate from a substrate or substrates on which FETs Q1-Q4 are formed.

FETs Q1-Q4 can be fabricated with varying channel width/length ratios. In one embodiment FETs Q3 and Q4 are fabricated to have equal gate lengths. However the gate width of FET Q4 is N times smaller than that of FET Q3. Since the drains of FETs Q3 and Q4 are directly coupled together, and since the sources of FETs Q3 and Q4 are maintained at the same potential by op amp 410, the resistance between the source and drain of Q4 should be N times higher than the resistance between the source and drain of FET Q3 during the charging mode of operation. As such, Icrep=Icharge/N, which is a relationship that can be used by a processing unit to calculate, for example, a real time value for Icharge. In one embodiment, FETs Q1 and Q2 are fabricated to have equal gate lengths. However, the gate width of Q2 is M times smaller than that FET Q1. Since the drains of FETs Q1 and Q2 are directly coupled together, and since the sources of FETs Q1 and Q2 are maintained at the same potential by op amp 412, the resistance between the source and drain of Q2 should be M times higher than the resistance between the source and drain of FET Q1 during the discharging mode of operation. As such, Idrep=Idiscahrge/M, which is a relationship that can be used by a processing unit to calculate, for example, a real time digital equivalent for Idischarge+Idrep.

For purposes of explanation only, it will be presumed that FETs Q1-Q4 are configured so that M=N. The value of N can be selected to range from 1000 to 50,000 it being understood that the value of N should not be limited thereto. If the ratio of the gate widths between FETs Q3 and Q4 or between the FETs Q1 and Q2 is slightly deviated from N, the algorithms of processing unit can be configured to account for the deviation when it calculates, for example, real time values for Icharge or Idischarge. Although not shown within the figures, a circuit may be employed that can be used to directly or indirectly measure each of the gate widths for FETs Q1-Q4. These more accurately measured widths can be provided to the processing unit to enable more accurate algorithms for calculating values for parameters such as Icharge or Idischarge.

Figure 5:
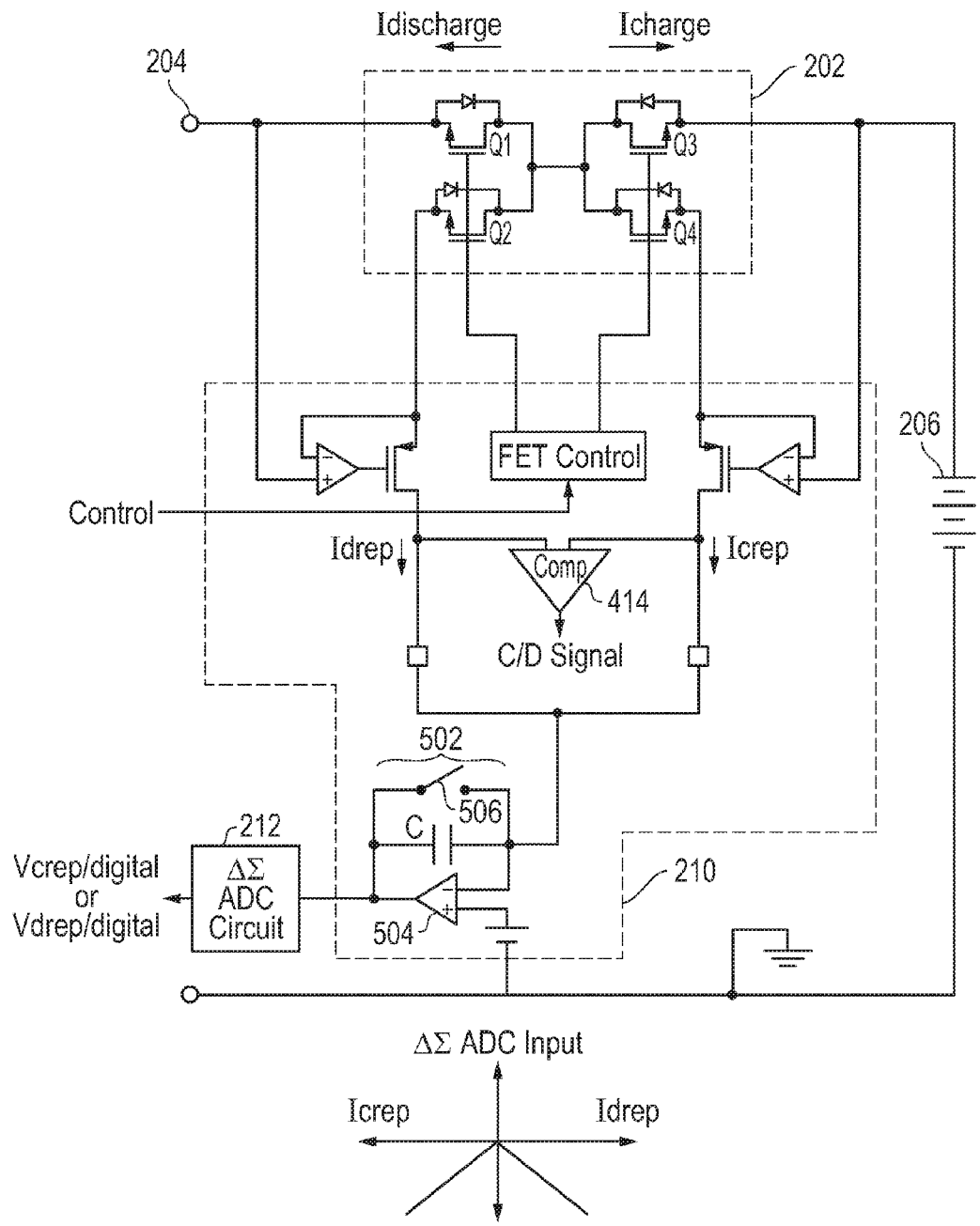
FIG. 5 is a block diagram illustrating another embodiment of the battery management circuit shown in FIG. 2.

FIG. 5 shows an alternative embodiment of the battery management control circuit of FIG. 2. Battery management control circuit 500 contains many of the same components of battery management control circuit 400 (FIG. 4) including the C/D control circuit, FET control circuit, and voltage comparator circuit. Notwithstanding similarities, substantial differences exist. For example the I/V conversion circuit 210 of circuit 500 employs a current-integrating amplifier circuit 502 instead of a resistor R to generate analog voltage Vcrep or Vdrep. Moreover, the processing units (not shown) may calculate real time values for current flow into or out of battery 206 and/or the charge level thereon using different algorithms.

With continuing reference to FIG. 5, the C/D control circuit, FET control circuit, and voltage comparator circuit of battery management control circuit 500 operate in substantially the same manner as corresponding components in the battery management control circuit 400 of FIG. 4. Analog voltages Vcrep and Vdrep, however, are generated differently. Vdrep or Vcrep is generated by current-integrating amplifier circuit 502 that includes an op amp 504 and a switched capacitor C, which is coupled between the output of op amp 504 and the negative, high impedance input of op amp 504. Although not shown, the positive, high input impedance of op amp 504 is coupled to a fixed DC voltage, which in turn maintains the negative input of op amp 504 at a constant voltage. A switch 506 is controlled by the processing unit and is coupled across capacitor C as shown. ADC 212 samples the analog voltage Vcrep or Vdrep at the output of op amp 504 to generate Vcrep/digital or Vdrep/digital, respectively, just before capacitor C is discharged by switch 506.

During the charge or discharge mode of operation, Icrep or Idrep charges capacitor C. The charge accumulation on capacitor C lowers the potential at the output of op amp 504. FIG. 5 graphically illustrates a relationship between flow of Icrep and Idrep into capacitor C and the analog voltage at the output of op amp 504 just before switch 506 closes. The graph of FIG. 5 presumes switch 506 closes at a constant frequency. Before capacitor C is discharged by the processing unit via switch 506, ADC 212 samples the analog voltage at the output of op amp 504 and generates a corresponding digital equivalent Vcrep/digital or Vdrep/digital. Just after sampling, the processing unit closes switch 506, which discharges C, and the process repeats. The processing unit can vary the frequency of which ADC 212 samples the analog voltage at the output of op amp 504. However, when the sampling frequency is changed, the processing unit should correspondingly change the frequency at which capacitor C is discharged.

The processing unit may calculate values for Icharge or Idischarge+Idrep as a function of Vcrep/digital or Vdrep/digital, respectively, when the C/D signal indicates that battery management control circuit 500 is in the charging mode of operation or discharging mode of operation, respectively. The processing unit may also calculate the charge level on battery 206 as a function of Vdrep/digital or Vcrep/digital. These values may also be calculated as a function of the capacitance of C and the frequency at which ADC 212 samples the output of op amp 504. The calculations may also rely on the known relationships that exist between the voltage at the input of ADC circuit 212 and the current that charges capacitor C as exemplified by the graph in FIG. 5. Moreover, the calculations may rely on the known relationships Icrep=Icharge/N or Idrep=Idischarge/N.

The processing unit compares the calculated values for Icharge and/or battery charge level to respective predetermined values. If the value for Icharge and/or if the battery charge level exceed their respective predetermined values, at the very least FETs Q3 and Q4 are turned off. In the discharge mode of operation, the processing unit compares the calculated values for Idischarge+Idrep and/or battery charge level to respective predetermined values. If the calculated value for Idischarge+Idrep exceeds the predetermined value against which it is compared, and/or if the calculated battery charge level drops below the predetermined value against which it is compared, FETs Q1 and Q2 should be turned off.

Figure 6:
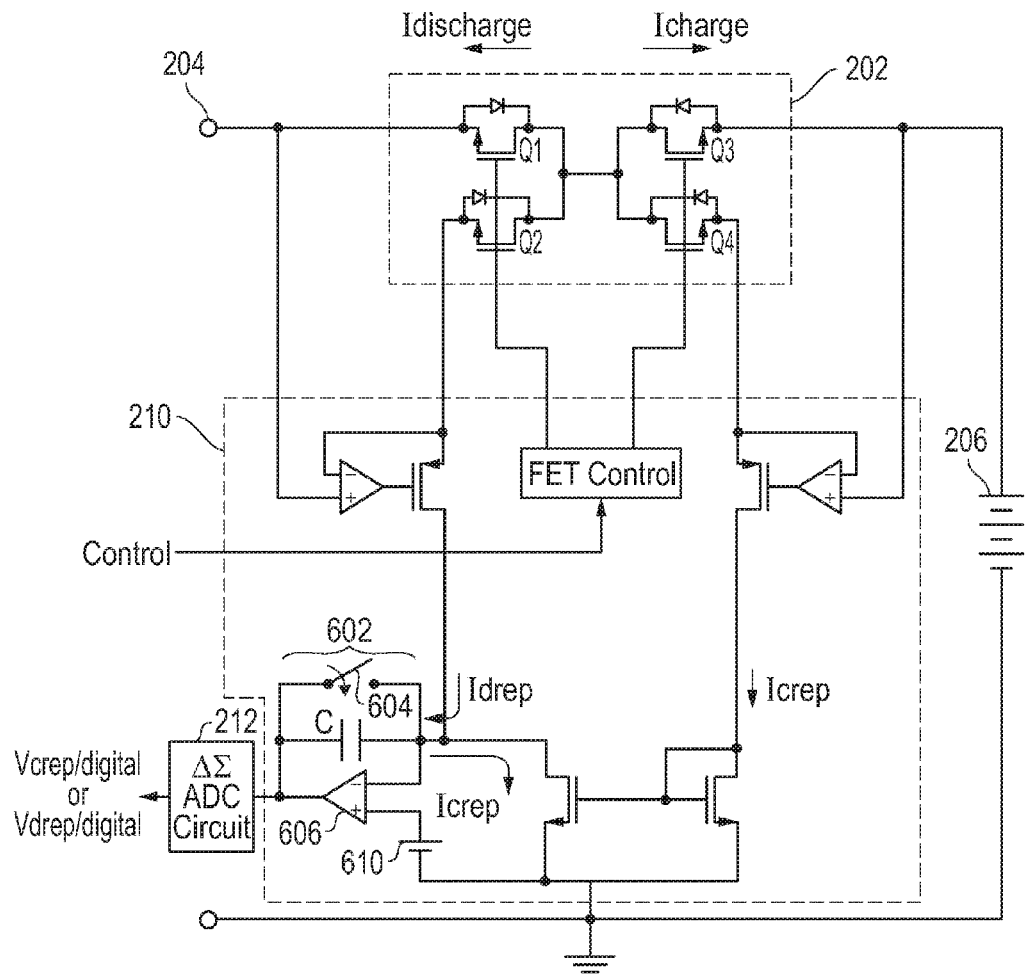
FIG. 6 is a block diagram illustrating yet another embodiment of the battery management circuit shown in FIG. 2.
Figure 6:
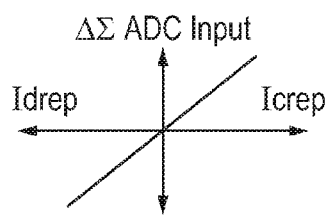

FIG. 6 shows another embodiment of the battery management control circuit of FIG. 2. Circuit 600 includes the same C/D control circuit and ADC circuit employed in the battery management circuit of FIGS. 4 and 5. The I/V conversion circuit, however, is substantially different. Moreover, the processing unit (not shown) may calculate values for current flow into or out of battery 206 and/or the charge level using algorithms that are different than the algorithms used by the processing unit in the battery management circuit of FIGS. 4 and 5.

Battery management circuit 600 employs a current-integrating amplifier circuit 602 that can generate Vcrep or Vdrep as a function of Idrep or Icrep, respectively. The current-integrating amplifier circuit 602 includes a switch 604, a capacitor C and op amp 606 coupled together as shown. One high impedance input of op amp 606 is coupled to a DC voltage source 610 as shown, while the other high impedance input of op amp 606 is coupled to capacitor C. During the discharging mode of operation, Idrep flows to capacitor C. During the charging mode of operation, Icrep flows through FET Q4, while a minor of Icrep flows out of capacitor C to ground via FET 610.

Switch 604 is closed at a frequency defined by the processing unit. Before the switch 604 closes, ADC 212 samples the analog voltage at the output of op amp 606 and generates a corresponding digital equivalent Vcrep/digital or Vdrep/digital. As seen by the graph in FIG. 6, a linear relationship exists between the voltage Vdrep or Vcrep, which is present at ADC circuit 212, and the flow of Idrep or Icrep into or out, respectively, of capacitor C. The relationship (e.g., slope) illustrated in the graph may depend on the frequency at which capacitor C is discharged by switch 604. It is noted that the processing unit may alter the frequency at which switch 604 closes. For example, if the magnitude of Idrep or Icrep, as calculated by the processing circuit, substantially increases or decreases, the processing unit may increase or decrease the frequency at which switch 604 discharges capacitor C. A change in this frequency may require a corresponding change in the algorithm used to calculate values for Icharge or Idischarge in addition to a corresponding change in the frequency at which ADC circuit 212 samples the analog voltage Vcrep or Vdrep. Regardless the frequency at which switch 604 and ADC circuit 212 operate, Vcrep/digital or Vdrep/digital can be used by the processing unit to calculate real time values for current flow into or out of battery 206 in addition to charge level thereon. The values may be generated as a function of the capacitance of C, which is static, and the frequency at ADC circuit 212 samples the output of op amp 606. The calculations may rely on the known relationships that exist between the analog voltage at the input of ADC circuit 212 and the current that charges capacitor C as exemplified by the graph in FIG. 6. Moreover, the calculations may rely on the known relationships Icrep=Icharge/N and Idrep=Idischarge/N. The processing unit, however, does not need a C/D signal since the polarity of the digital signal generated by ADC circuit 212 will indicate whether the battery management circuit 600 is in the charge or discharge mode of operation.

Like the battery management circuits of FIGS. 1-5, the processing unit of battery management circuit 600 compares calculated values for Icharge and/or battery charge level to respective predetermined values. If the value for Icharge and/ or if the charge level exceed their respective predetermined values, FETs Q3 and Q4 are turned off. In the discharge mode of operation, the processing unit compares calculated values for Idischarge+Idrep and/or charge level to respective predetermined values. If the calculated value for Idischarge+Idrep exceeds the predetermined value against which it is compared, and/or if the calculated battery charge level drops below the predetermined value against which it is compared, FETs Q1 and Q2 should be turned off.

Figure 7:
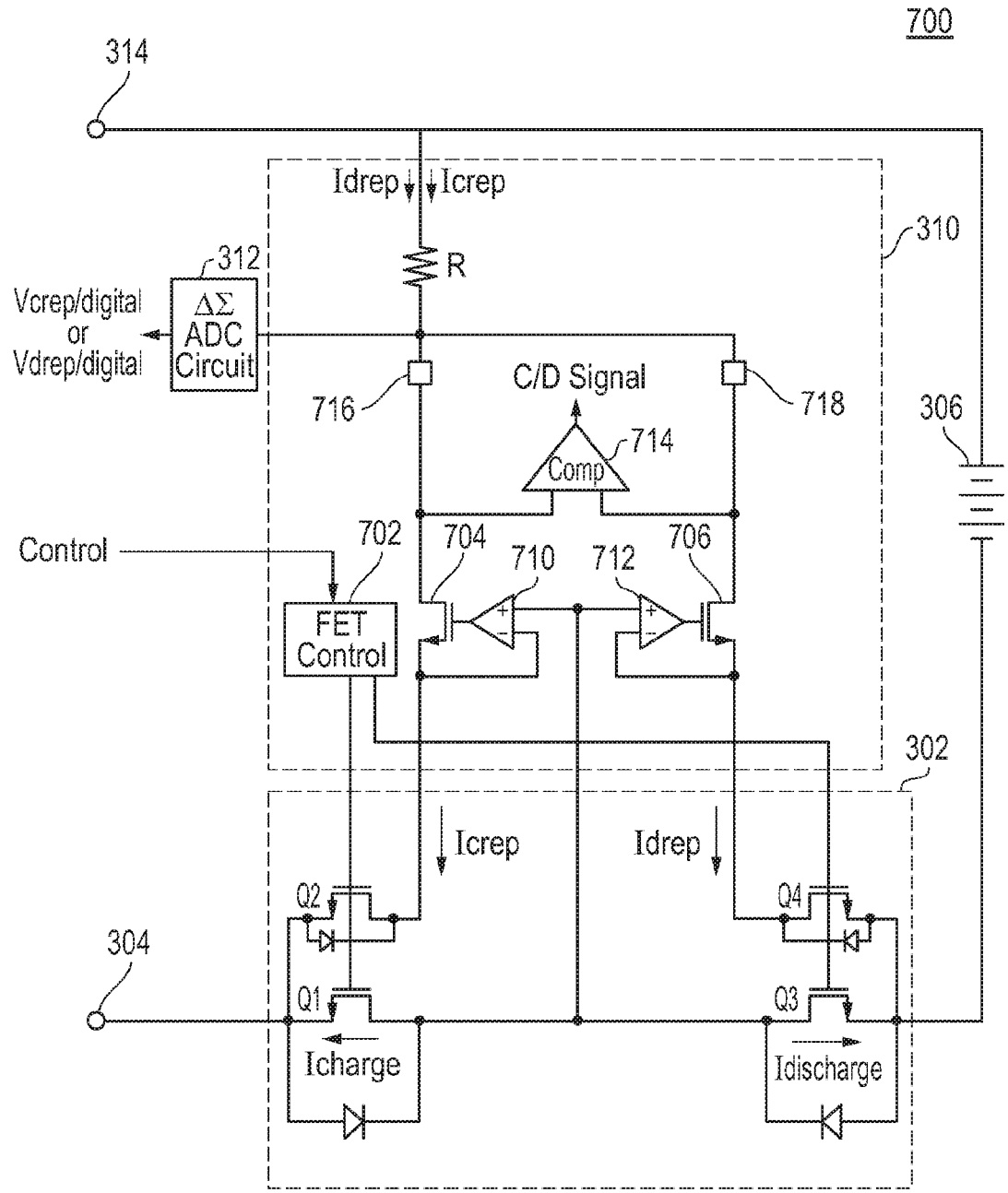
FIG. 7 is a block diagram illustrating an embodiment of the battery management circuit shown in FIG. 3.

FIG. 7 shows an embodiment of the battery management control circuit of FIG. 3. The C/D control circuit 302 includes a set of field effect transistors (FETs) Q1-Q4 coupled between node 304 and rechargeable battery 306 as shown. I/V conversion circuit 310 includes a resistor R coupled to node 314 and ADC circuit 312. A FET control circuit 702 controls FETs Q1-Q4. Gates of FETs 704 and 706 are coupled to outputs of operational amplifiers (op amps) 710 and 712, respectively. High impedance inputs to op amp 710 are coupled to the drains of FETs Q1 and Q2, while high impedance inputs to op amp 712 are coupled to the drains of FETs Q3 and Q4. In this configuration op amp 710 maintains the drains of FETs Q1 and Q2 at the same potential, and op amp 712 maintains the drains of FETs Q3 and Q4 at the same potential.

During the charging mode of operation, FET control 702 activates FETs Q1-Q4. Icrep, a portion of the source current from the charging source (not shown) coupled to node 314, is drawn to C/D control circuit 302 and creates a voltage drop Vcrep across resistor R. Icharge, the remaining portion of the source current, charges battery 306. ADC circuit 312 samples Vcrep at regularly scheduled times and generates digital equivalents Vcrep/digital, which in turn can be used to monitor Icharge and the charge level on battery 306. If Icharge or the battery charge level exceeds respective predetermined values, FET control 702 turns off at least Q1 and Q2 in accordance with an input signal received indirectly from the processing unit (not show). During the battery discharge mode of operation, Idrep, a portion of the discharge current from battery 306, is drawn to C/D control circuit 302 and creates a voltage drop Vdrep across resistor R. Idischarge, the remaining portion of the battery discharge current, drives a load (not shown) at node 314. ADC circuit 312 samples Vdrep at regularly scheduled times and generates digital equivalents Vdrep/digital, which in turn can be used to monitor Idischarge and the charge level on battery 306. If the current flow is too high and/or if the battery charge level is too low, FET control 702 in one embodiment turns off at least Q3 and Q4 in accordance with input signals indirectly received from the processing unit.

I/V conversion circuit 310 includes a voltage comparator 714 with high impedance inputs, which compares the voltages at the drains of FETs 704 and 706. In the charging mode, Icrep flows through FET 704 after creating a voltage drop across resistive element 716. Because no current flows through FET 706 during the charging mode, the voltage at the drain of FET 704 will be lower than the voltage at the drain of FET 706. Comparator circuit 714 detects this difference and generates a first C/D signal (e.g., a logical one or high voltage), which indicates that battery management control circuit 700 is in the charging mode of operation. In the discharging mode, Idrep flows through FET 706 after creating a voltage drop across resistive element 718. Because no current flows through FET 704 during the discharge mode, the voltage at the drain of FET 706 will be lower than the voltage at the drain of FET 704. Comparator circuit 714 detects this voltage difference and generates a second C/D signal (e.g., a logical zero or low voltage), which indicates to the processing unit that battery management control circuit 700 is in the discharge mode of operation.

When the processing unit receives a C/D control signal indicating that battery management control circuit 700 is in the charging mode of operation, the processing unit may calculate values for Icharge and/or the charge level on battery 706 as a function of Vcrep/digital, the impedance of R and a known relationship between Icharge and Icrep, which is more fully described below. The processing unit compares the values for Icharge and/or charge level to respective predetermined values. If the values for Icharge and/or if the charge level exceed their respective predetermined values, C/D control circuit 302 should interrupt the flow of charging current into battery 306 by turning off at least FETs Q1 and Q2. When the processing unit receives a C/D control signal indicating a discharge mode of operation, the processing unit may calculate values for Idischarge+Idrep (discharge current from battery 306) and/or the charge level on battery 306 as a function of Vdrep/digital, the impedance of R, and a known relationship between Idischarge and Idrep, which is more fully described below. The processing unit compares the values for Idischarge+Idrep and/or charge level to respective predetermined values. If the calculated value for Idischarge+Idrep exceeds the predetermined value against which it is compared, and/or if the calculated battery charge level drops below the predetermined value against which it is compared, C/D control circuit 302 should be instructed to interrupt the flow of current out of battery 206 by turning off at least FETs Q3 and Q4.

FETs Q3 and Q4 in FIG. 7 can be fabricated to have equal gate lengths. However the gate width of FET Q4 is N times smaller than that of FET Q3. Since the sources of FETs Q3 and Q4 are directly coupled together, and since the drains of FETs Q3 and Q4 are maintained at the same potential by op amp 712, the resistance between the source and drain of Q4 should be N times higher than the resistance between the source and drain of FET Q3 during the discharging mode of operation. As such, Idrep=Idischarge/N, which is a relationship that can be used by a processing unit to calculate, for example, a real time value for Idischarge. FETs Q1 and Q2 are fabricated to have equal gate lengths. However, the gate width of Q2 is M times smaller than that FET Q1. Since the sources of FETs Q1 and Q2 are directly coupled together, and since the drains of FETs Q1 and Q2 are maintained at the same potential by op amp 710, the resistance between the source and drain of Q2 should be M times higher than the resistance between the source and drain of FET Q1 during the charging mode of operation. As such, Icrep=Icharge/M, which is a relationship that can be used by a processing unit to calculate, for example, a real time values for Icharge. For purposes of explanation only, it will be presumed that FETs Q1-Q4 are configured so that M=N.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

We claim:

1. An apparatus comprising:
a first circuit coupled between a first node and a second node, wherein the first circuit is configured to receive a source current via the first node and a battery discharge current via the second node, wherein the first circuit is configured to divide the source current into first and second portions Ic and Icr, respectively; wherein the first circuit is configured to divide the battery discharge current into first and second portions Idc and Idcr, respectively; wherein the first circuit is configured to transmit Ic to the second node, and wherein the first circuit is configured to transmit Idc to the first node;
a second circuit coupled to the first circuit and configured to receive Icr and Idcr, wherein the second circuit is configured to generate a first voltage that is related to Icr, wherein the second circuit is configured to generate a second voltage that is related to Idcr;
an analog-to-digital (ADC) conversion circuit coupled to the second circuit, wherein the ADC circuit is configured to generate a first digital signal that represents the first voltage, and wherein the ADC circuit is configured to generate a second digital signal that represents the second voltage;
wherein Icr is equal Ic/N;
wherein Idcr is equal to Idc/M;
where N and M are values greater than one;
wherein the first circuit comprises:
a first FET comprising a first source coupled to the first node and configured to receive the source current, a first drain, and a first gate;

a second FET comprising a second source, a second drain, and a second gate;

a third FET comprising a third source coupled to the second node and configured to receive the battery discharge current, a third drain, and a third gate, and;

a fourth FET comprising a fourth source, a fourth drain, and a fourth gate;

wherein the first, second, third, and fourth drains are coupled together;

wherein the first and second gates are coupled together;

wherein the third and fourth gates are coupled together;

wherein the first and second sources are coupled to the second circuit and configured to be at one common voltage in order to transmit Idcr to the second FET;

wherein the third and fourth sources are coupled to the second circuit and configured to be at another common voltage in order to transmit Icr to the fourth FET.

2. The apparatus of claim 1 further comprising:

a processing unit coupled the ADC circuit, wherein the processing unit comprises a memory that stores instructions that are executable by the processing unit;

wherein the processing unit generates first and second control signals in response to receiving and processing the first and second digital signals, respectively, in accordance with the instructions.

3. The apparatus of claim 2 wherein the first circuit is configured to end transmission of Ic to the second node in response to the processing unit generating the first control signal, and wherein the first circuit is configured to end transmission of Idc to the first node in response to the processing unit generating the second control signal.

4. The apparatus of claim 3 wherein the processing unit is configured to generate the first control signal if the first digital signal exceeds a first predetermined value, and wherein the processing unit is configured to generate the second control signal if the second digital signal exceeds a second predetermined value.

5. The apparatus of claim 3 further comprising a rechargeable battery coupled to the second node.

6. The apparatus of claim 1 wherein the first and second FETs are fabricated on a first die, and wherein the third and fourth FETs are fabricated on a second, seperate die.

7. The apparatus of claim 1 wherein the first, second, third, and fourth FETs are fabricated on the same die.

8. The apparatus of claim 1 wherein M is equal to N.

9. The apparatus of claim 1 wherein the second circuit comprises a circuit for receiving and integrating Icr or Idcr using a capacitor, wherein the circuit generates the first voltage in response to integrating the charge of Icr, and wherein the circuit generates the second voltage in response to integrating the charge of Idcr.

10. The apparatus of claim 2 wherein the second circuit comprises a circuit for receiving and integrating Icr using a capacitor, wherein the circuit generates the first voltage in response to integrating the charge of Icr.

11. The apparatus of claim 10 wherein the circuit comprises a switch that is configured to discharge the capacitor in response to the switch receiving a control signal from the processing unit, wherein the processing unit is configured to generate the switch control signal in response to processing the first digital signal.

12. The apparatus of claim 1 wherein the second circuit is configured to maintain the first and second sources at a first voltage with respect to ground, wherein the second circuit is configured to maintain the third and fourth sources at a second voltage with respect to ground.

13. The apparatus of claim 1 wherein the second circuit comprises a resistor coupled to a pair of terminals and configured to receive Icr or Idcr, wherein the resistor is configured to generate the first voltage between the pair of terminals in response to the resistor receiving Icr, and wherein the resistor is configured to generate the second voltage between the pair of terminals in response to the resistor receiving Idcr.

* * * * *